(12) United States Patent
Chen et al.

(10) Patent No.: US 7,009,236 B2
(45) Date of Patent: Mar. 7, 2006

(54) MEMORY DEVICE WITH VERTICAL TRANSISTORS AND DEEP TRENCH CAPACITORS AND METHOD OF FABRICATING THE SAME

(75) Inventors: Yi-Nan Chen, Taipei (TW); Hui-Min Mao, Taipei (TW); Chih-Yuan Hsiao, Taipei (TW); Ming-Cheng Chang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 37 days.

(21) Appl. No.: 10/691,173

(22) Filed: Oct. 22, 2003

(65) Prior Publication Data

US 2005/0001256 A1    Jan. 6, 2005

(30) Foreign Application Priority Data

Jul. 3, 2003    (TW) ................................ 92118167 A

(51) Int. Cl.
*H01L 27/108* (2006.01)

(52) U.S. Cl. ...................... 257/301; 257/302; 257/304; 257/296; 257/300; 257/305; 257/303; 257/329

(58) Field of Classification Search ................ 257/301, 257/302, 304, 296, 300, 305, 303, 329
See application file for complete search history.

(56) References Cited

U.S. PATENT DOCUMENTS

| 6,770,928 B1 * | 8/2004 | Sommer et al. ............. 257/301 |
| 6,800,898 B1 * | 10/2004 | Cappelani et al. .......... 257/329 |
| 6,853,025 B1 * | 2/2005 | Tews et al. .................. 257/303 |

* cited by examiner

*Primary Examiner*—Mai-Huong Tran
(74) *Attorney, Agent, or Firm*—Quintero Law Office

(57) ABSTRACT

A memory device with vertical transistors and deep trench capacitors. The device includes a substrate containing at least one deep trench and a capacitor deposited in the lower portion of the deep trench. A conducting structure, having a first conductive layer and a second conductive layer, is deposited on the trench capacitor. A ring shaped insulator is deposited on the sidewall and between the substrate and the first conductive layer. The first conductive layer is surrounded by the ring shaped insulator, and the second conductive layer is deposited on the first conductive layer and the ring shaped insulator. A diffusion barrier between the second conductive layer and the substrate of the deep trench is deposited on one side of the sidewall of the deep trench. A TTO is deposited on the conducting structure. A control gate is deposited on the TTO.

12 Claims, 5 Drawing Sheets

MEMORY DEVICE WITH VERTICAL TRANSISTORS AND DEEP TRENCH CAPACITORS AND METHOD OF FABRICATING THE SAME

BACKGROUND OF THE INVENTION

1. Field of the Invention

The present invention relates to a dynamic random access memory (DRAM) and in particular to a DRAM with vertical transistors and deep trench capacitors.

2. Description of the Related Art

With the wide application of integrated circuits (ICs), several kinds of semiconductor devices with higher efficiency and lower cost are produced based to meet different demands.

Typically a DRAM cell has one transistor and one is capacitor and memory capacity has reached 64 MB and can reach up to 256 MB. Therefore, to achieve increased integration it is necessary to reduce the size of memory cells and transistors to produce DRAM with higher memory capacity and processing speed. A three dimensional (3-D) capacitor structure can reduce the area occupied on a semiconductor substrate, and 3-D capacitors, such as deep trench capacitors, are applied in the fabrication of DRAM of 64 MB and above. A traditional plane transistor requires a large area of the semiconductor substrate and cannot satisfy the demands of high integration. Therefore, space saving, vertical transistors have become a trend in memory unit fabrication. A prevalent DRAM cell array integrates vertical transistors with trench capacitors.

Memory cells with vertical transistors and trench capacitors have several drawbacks as described below. As memory capacity is enhanced, more compact transistors and deep trench capacitors are necessary to satisfy the requirements of enlarged DRAM memory capacity. As shown in FIG. 1, the outdiffusion of dopants contained in the buried strap may merge and result in a short channel effect. Therefore, it is impossible to decrease the distance between the wordlines and deep trench capacitors to increase the integration of the DRAM.

SUMMARY OF THE INVENTION

Accordingly, an object of the invention is to provide a memory device with vertical transistors and deep trench capacitors and a method of fabricating the same, thereby preventing merged buried straps.

One feature of the present invention is use of the diffusion barrier between the second conductive layer and the substrate of the deep trench is only deposited on one side of the sidewall of the deep trench, such that dopants of the first conductive layer diffuse into only one side of the trench of the substrate to form the buried strap. Therefore, merged buried straps are prevented, and the buried strap is formed on only one side of the trench.

Another feature of the present invention is the formation of the diffusion barrier. First, nitrogen-containing ion implantation is performed in the bottom and on only one side of the sidewall of the trench. Next, oxidation is performed, such that the thickness of the oxide layer in the implanted area can be thinner than in the other area. After removing parts of the oxide layer, the oxide layer remains on one side of the sidewall of the trench to serve as a diffusion barrier.

To achieve the above objects, one aspect of the present invention provides a memory device with vertical transistors and deep trench capacitors. The device includes a substrate containing at least one deep trench and a capacitor deposited in the lower portion of the deep trench. A conducting structure, having a first conductive layer and a second conductive layer, is deposited on the trench capacitor. A ring shaped insulator is deposited on the sidewall and between the substrate and the first conductive layer. The first conductive layer is surrounded by the ring shaped insulator, and the second conductive layer is deposited on the first conductive layer and the ring shaped insulator. A diffusion barrier between the second conductive layer and the substrate of the deep trench is deposited on one side of the sidewall of the deep trench by thermal oxidation. A trench top isolation is deposited on the conducting structure. A control gate, having a control gate layer and a gate dielectric, layer, is deposited on the trench top oxide (TTO). A buried strap is deposited within the substrate beside the conducting structure. A doping area is provided within the substrate beside the control gate.

The memory device further comprises a buried strap deposited within the substrate beside parts of the conducting structure where the diffusion barrier is not deposited. The buried strap serves as a source.

The memory device still further comprises a doping area provided within the substrate beside the control gate. The doping area serves as a drain.

The ring shaped insulator comprises an oxide. The first conductive layer and the second conductive layer comprise a doped polysilicon or doped amorphous silicon. Additionally, the diffusion barrier comprises an oxide with a thickness substantially less than 100 Å. Furthermore, the trench top isolation comprises an oxide.

The control gate comprises a gate layer and a gate dielectric layer deposited between the gate layer and the substrate. The gate layer comprises a polysilicon, a is silicide, a metal layer, or a combination thereof, and the gate dielectric layer comprises an oxide.

The buried strap is electrically connected with the control gate and formed by diffusing dopants of the first conductive layer into the substrate of the trench surrounding the top of the second conductive layer.

Another aspect of the present invention provides a manufacturing method for a memory device with vertical transistors and trench capacitors. First, a substrate is provided. Next, at least one deep trench is formed in the substrate. A trench capacitor is formed in a lower position of the deep trench. A ring shaped insulator is formed on the sidewall of the deep trench above the trench capacitor, wherein a space is surrounded by the ring shaped insulator. A first conductive layer is subsequently formed to fill the space. A diffusion barrier is formed on one side of the sidewall of the deep trench above the ring shaped insulator. Then, a second conductive layer is formed on the first conductive layer and the ring shaped insulator and beside the diffusion barrier. A trench top isolation is formed on the second conductive layer and the diffusion barrier. Finally, a control gate is formed on the trench top isolation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

Figure 1:
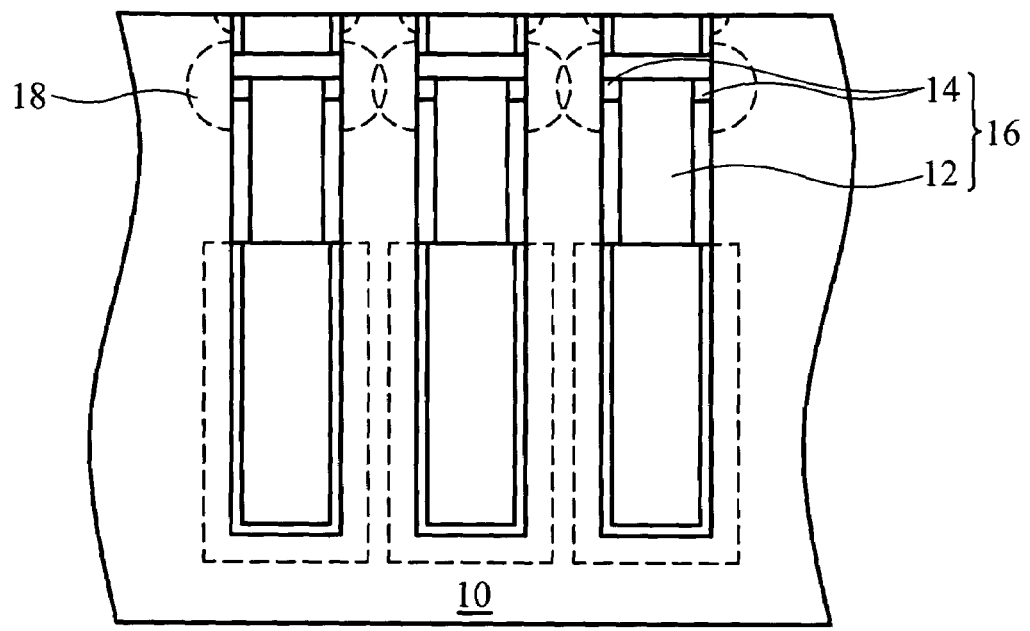
FIG. 1 is a cross-section illustrating the buried strap merge problem in the prior art.
Figure 2:
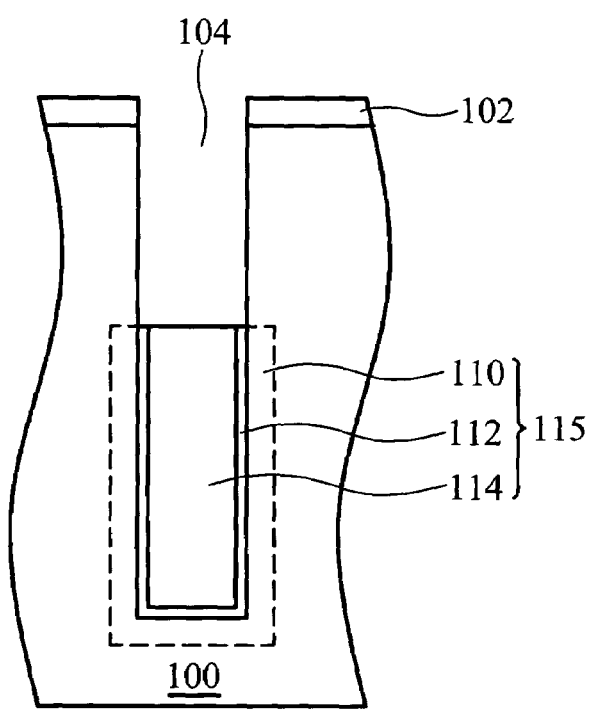
FIGS. 2 through 9 are cross-sections showing a manufacturing method for a memory device with vertical transistors and trench capacitors according to one embodiment of the invention.

First, in FIG. 2, a substrate 100 comprising silicon is provided. Next, a hard mask 102 comprising a pad oxide and a nitride with defined patterns is formed on the substrate 100. The substrate 100 is etched using the hard mask 102 as a shield to form at least one deep trench 104 in the substrate 100.

A trench capacitor 115 comprising a buried lower electrode 110, an upper electrode 114, and a conformal dielectric layer 112 between the buried lower electrode 110 and the upper electrode 114 is formed in a lower portion of the deep trench 104. The buried lower electrode deposited in the substrate 100 of the deep trench 104 is preferably doped by n-type dopants. The upper electrode 114 comprises a doped polysilicon. The conformal dielectric layer 112 comprises a silicon oxide, a silicon nitride, or the combination thereof.

The trench capacitor 115 can be formed by well known manufacturing technology as described in the following. First, the n-type doped dielectric layer comprising arsenic silicate glass (ASG) is conformally formed on the sidewall and the bottom of the deep trench 104. Next, a photoresist with a certain thickness is filled into the lower portion of the deep trench 104. Parts of the dielectric layer are removed by wet etching using the photoresist as a shield, thus the remaining dielectric layer is deposited in the lower portion of the deep trench 104. After removing the photoresist, an insulator comprising an oxide, such as TEOS, is preferably formed on the remaining dielectric layer. A thermal treatment is performed to drive the dopants of the doped dielectric layer into the substrate 100 beside the deep trench 104 so as to form the buried plate (BP) serving as a lower electrode 110. Subsequently, the insulator and the doped dielectric layer are removed. A dielectric layer is conformally formed on the bottom and the sidewall of the deep trench 104, and a conductive layer fills the deep trench 104. Finally, parts of the dielectric layer and the conductive layer in the upper portion of the deep trench are removed by etching, thus the dielectric layer 112 and the upper electrode 114 of the trench capacitor 115 are obtained.

Figure 3:
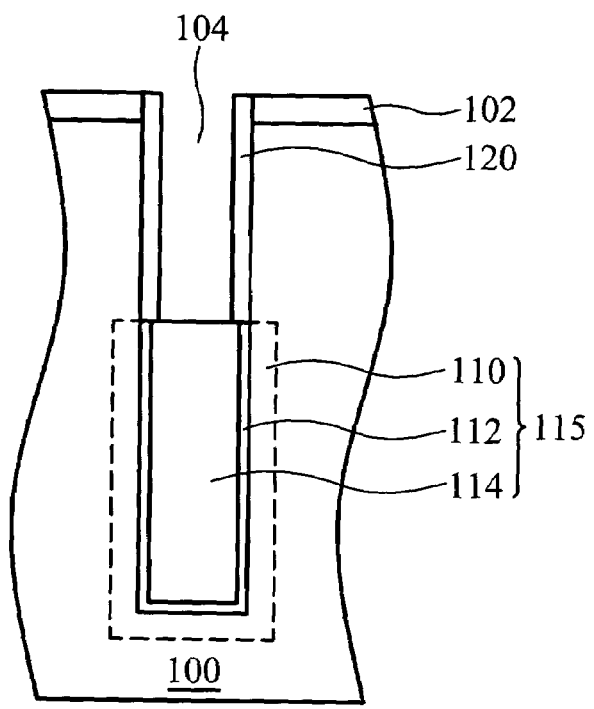

Next, as shown in FIG. 3, a conformal insulator comprising silicon oxide is preferably formed on the sidewall of the deep trench 104 and the surface of the trench capacitor 115 by chemical vapor deposition (CVD). Then, parts of the conformal insulator are removed by anisotropic etching so as to remain parts of the insulator on the sidewall of the deep trench 104. Thus, a ring shaped insulator is obtained on the sidewall of the deep trench 104 above the trench capacitor, wherein a space is surrounded by the ring shaped insulator 120.

Figure 4:
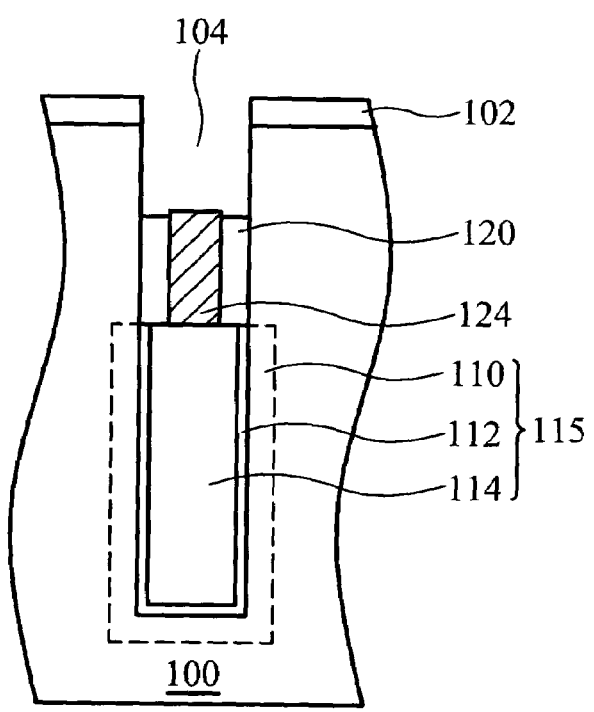

As shown in FIG. 4, a first conductive layer comprising a doped polysilicon or doped amorphous silicon is preferably formed by CVD to fill the deep trench 104. The concentration of dopant in the first conductive layer is about $10^{14}$~$10^{15}$ atomic numbers per cubic centimeter. Then, a chemical mechanical polishing (CMP) and an etching are performed to planarize and remove parts of the first conductive layer to leave a planar first conductive layer 124 filling the space surrounding by the ring shaped insulator 120. The thickness of the ring shaped insulator 120 is preferably less than the first conductive layer 124.

Figure 5:
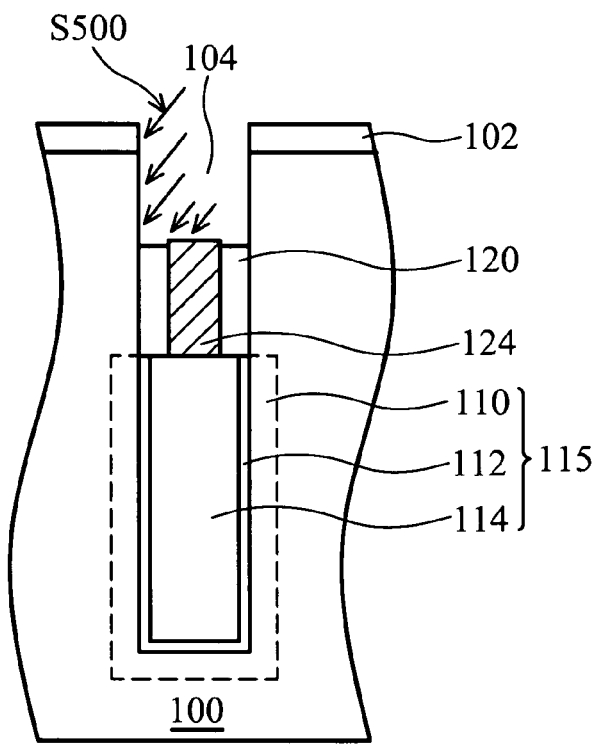

In FIG. 5, a nitridation S500 is performed in the bottom and only one side of the sidewall of the trench 104. The nitridation S500 preferably comprises a nitrogen-containing ion implantation. The nitrogen-containing ions are implanted into the bottom and only one side of the sidewall of the trench 104 with a tilting angle of about 5~10°.

Figure 6:
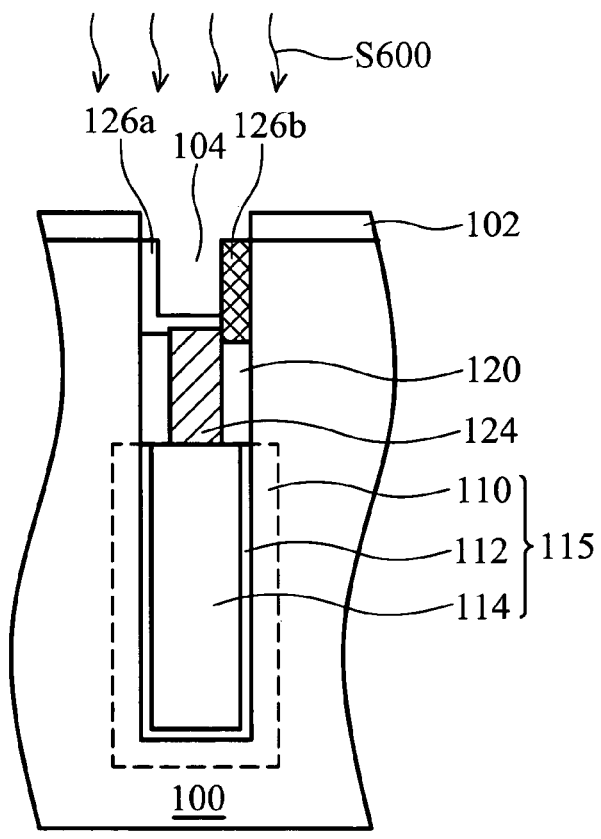

In FIG. 6, an oxidation S600 is performed in the sidewall and the bottom of the trench 104 by thermal oxidation at a temperature of about 900~1000° C. As is well known in the art, it is difficult to oxidize the nitride. Thus, after the oxidation S600, a thin oxide layer 126a is formed on the bottom and one side of the sidewall of the trench 104 which is the nitridation area, and a thick oxide layer 126b is formed on the other side of the sidewall which is not in the nitridation area.

Figure 7:
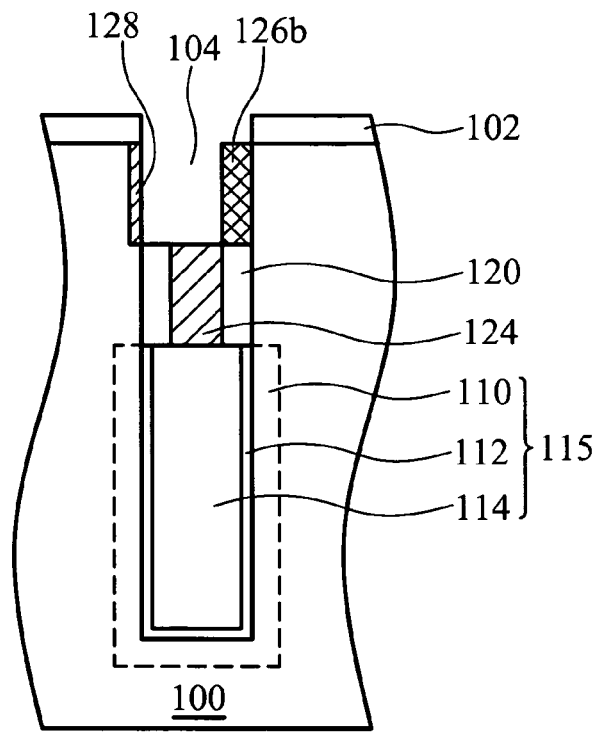

In FIG. 7, parts of the oxide layer 126a, 126b is removed by wet etching containing HF solution to leave the thick oxide layer 126b, such that the thick oxide layer 126b serves as a diffusion barrier on only one side of the sidewall of the deep trench 104 above the ring shaped insulator 120. A nitrogen-containing gas is introduced into the sidewall of the trench 104 without the diffusion barrier 126b to form a thin nitride layer 128 as a buried strap interface with thickness of about 10~20 Å.

Figure 8:
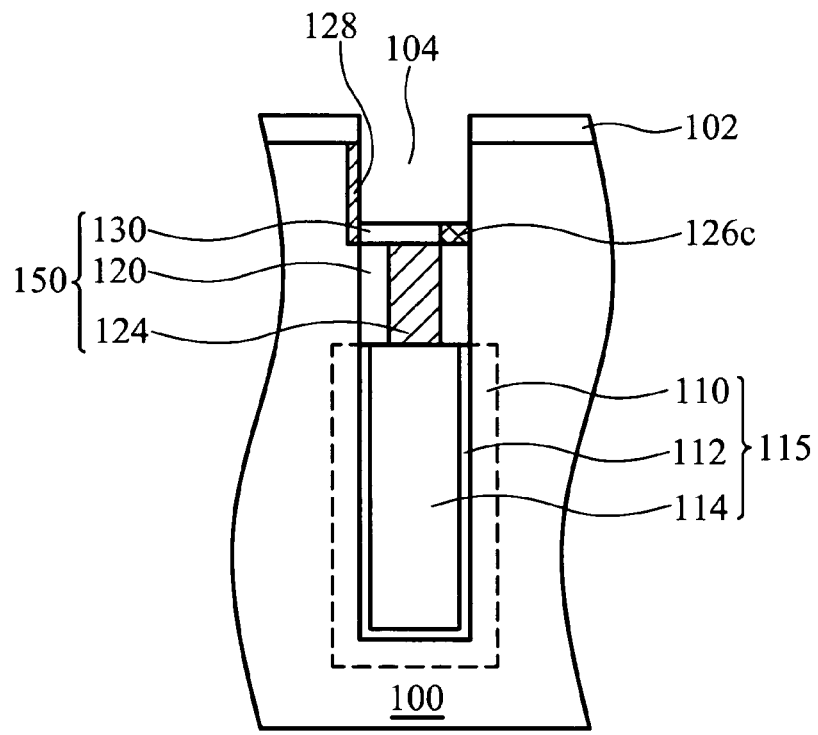

In FIG. 8, a second conductive layer 130 comprising a doped polysilicon or doped amorphous silicon is preferably formed on the first conductive layer 124 and the ring shaped insulator 120 and beside the diffusion barrier 126b by CVD. Parts of the diffusion barrier 126b is removed using the second conductive layer 130 as a shield until the thickness of the remaining diffusion barrier 126c and that of the second conductive layer 130 are the same. The first conductive layer 124 and the second conductive layer 130 construct a conducting structure 150.

Figure 9:
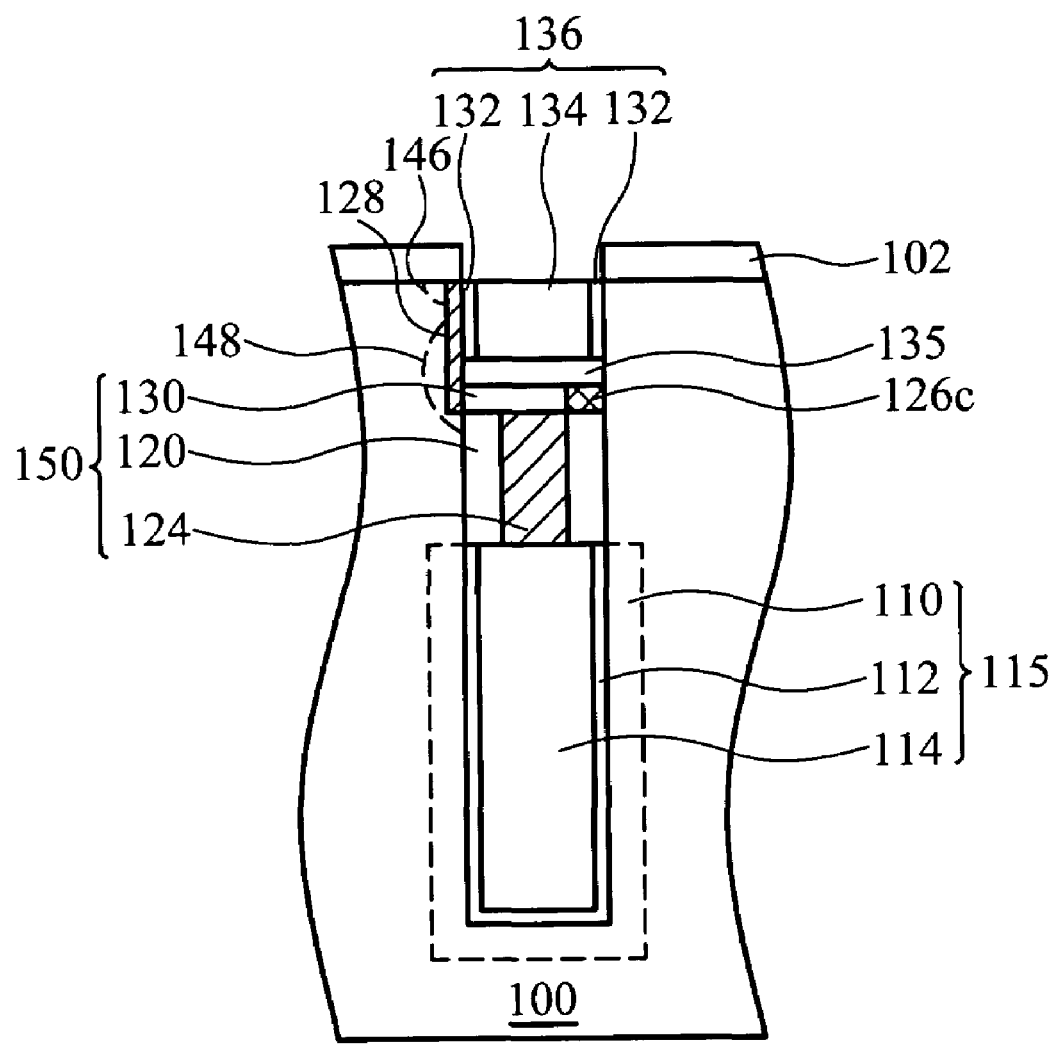

In FIG. 9, a trench top isolation 135 comprising a silicon oxide is preferably formed on the second conductive layer 130 and the diffusion barrier 126c by high density plasma chemical vapor deposition (HDP CVD).

A control gate 136 comprises a gate layer 134 and a gate dielectric layer 132 is formed on the trench top isolation 135. The gate layer 134 comprises a polysilicon, a silicide, a metal layer, or a combination thereof. The gate dielectric layer 132 comprising an oxide is preferably formed between the gate layer 134 and the substrate 100 by thermal oxidation. The trench top isolation 135 prevents electrical connection between the conducting structure 150 and the control gate 136.

Subsequently, a doping area 146 serving as a drain is preferably formed within the substrate 100 beside the control gate 136 by ion implantation.

Finally, a buried strap 148 is formed by diffusing dopants of the first conductive layer 124 through the second conductive layer 130 into the substrate 100 beside the top of the second conductive layer 130. The buried strap 148 is formed on only one side beside the trench 104, due to the diffusion barrier 126c used in the other side of the trench 104. The buried strap 148 serving as a source is electrically connected with the control gate 136. Therefore, the buried strap 148 in single side of the trench 104 can avoid buried strap merge problem.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device with vertical transistors and trench capacitors, comprising:
    a substrate, having at least one deep trench therein;
    a trench capacitor, deposited in a lower position of the deep trench;
    a conducting structure, deposited on the trench capacitor, comprising a first conductive layer and a second conductive layer;
    a ring shaped insulator, deposited on parts of the sidewall of the deep trench and between the substrate of the deep trench and the first conductive layer, such that the first conductive is surrounded by the ring shaped insulator, wherein the second conductive layer is deposited on the first conductive and the ring shaped insulator;
    a diffusion barrier, deposited on one side of the sidewall of the deep trench and between the second conductive layer and the substrate of the deep trench, comprising a thermal oxide;
    a trench top isolation, deposited on the conducting structure; and
    a control gate, deposited on the trench top isolation.

2. The memory device as claimed in claim 1, further comprising:
    a buried strap, deposited within the substrate beside parts of the conducting structure where the diffusion barrier is not deposited, serving as a source.

3. The memory device as claimed in claim 1, further comprising:
    a doping area, provided within the substrate beside the control gate, serving as a drain.

4. The memory device as claimed in claim 1, wherein the ring shaped insulator comprises an oxide.

5. The memory device as claimed in claim 1, wherein the first conductive layer comprises a doped polysilicon or a doped amorphous silicon.

6. The memory device as claimed in claim 1, wherein the second conductive layer comprises a doped polysilicon or a doped amorphous silicon.

7. The memory device as claimed in claim 1, wherein the thickness of the diffusion barrier is substantially less than 100 Å.

8. The memory device as claimed in claim 1, wherein the trench top isolation comprises an oxide.

9. The memory device as claimed in claim 1, wherein the control gate comprises a gate layer and a gate dielectric layer deposited between the gate layer and the substrate.

10. The memory device as claimed in claim 1, wherein the gate layer comprises a polysilicon, a silicide, a metal layer, or a combination thereof.

11. The memory device as claimed in claim 1, wherein the gate dielectric layer comprises an oxide.

12. The memory device as claimed in claim 2, wherein the buried strap is electrically connected with the control gate and formed by diffusing dopants of the first conductive layer into the substrate of the trench surrounding the top of the second conductive layer.

* * * * *